US010396229B2

(12) United States Patent
De Souza et al.

(10) Patent No.: US 10,396,229 B2
(45) Date of Patent: *Aug. 27, 2019

(54) SOLAR CELL WITH INTERDIGITATED BACK CONTACTS FORMED FROM HIGH AND LOW WORK-FUNCTION-TUNED SILICIDES OF THE SAME METAL

(75) Inventors: Joel P. De Souza, Putnam Valley, NY (US); Harold J. Hovel, Katonah, NY (US); Daniel A. Inns, Sunnyvale, CA (US); Jeehwan Kim, Los Angeles, CA (US); Christian Lavoie, Pleasentville, NY (US); Devendra K. Sadana, Pleasentville, NY (US); Katherine L. Saenger, Ossining, NY (US); Davood Shahrjerdi, Ossining, NY (US); Zhen Zhang, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 607 days.

This patent is subject to a terminal disclaimer.

(21) Appl. No.: 13/103,583

(22) Filed: May 9, 2011

(65) Prior Publication Data

US 2012/0285518 A1    Nov. 15, 2012

(51) Int. Cl.
*H01L 31/07* (2012.01)
*H01L 31/0224* (2006.01)
*H01L 31/18* (2006.01)
*H01L 31/068* (2012.01)

(52) U.S. Cl.
CPC .. *H01L 31/0682* (2013.01); *H01L 31/022441* (2013.01); *H01L 31/1804* (2013.01); *H01L 31/07* (2013.01); *H01L 31/1864* (2013.01); *Y02E 10/547* (2013.01); *Y02P 70/521* (2015.11)

(58) Field of Classification Search
CPC ......... H01L 31/1804; H01L 31/022425; H01L 31/0682; H01L 31/022441; H01L 31/068; H01L 31/03529; H01L 31/062; H01L 31/07; H01L 31/078; H01L 31/186; H01L 31/182; H01L 31/1864
USPC .................................................. 136/255, 261
See application file for complete search history.

(56) References Cited

U.S. PATENT DOCUMENTS

| 4,131,486 A * | 12/1978 | Brandhorst, Jr. ............. 136/255 |
| 6,724,010 B1 * | 4/2004 | Kwasnick ....... H01L 31/022408 257/458 |
| 2003/0178057 A1 * | 9/2003 | Fujii et al. .................... 136/256 |
| 2005/0016585 A1 * | 1/2005 | Munzer ......................... 136/261 |

(Continued)

OTHER PUBLICATIONS

Card et al., "MIS-Schottky theory under conditions of optical carrier generation in solar cells," Applied Physics Letters, vol. 29, No. 1, Jul. 1, 1976.

(Continued)

*Primary Examiner* — Andrew J Golden
(74) *Attorney, Agent, or Firm* — Law Office of Charles W. Peterson, Jr.; Louis J. Percello, Esq.; Erik K. Johnson, Esq.

(57) ABSTRACT

A solar cell having n-type and p-type interdigitated back contacts (IBCs), which cover the entire back surface of the absorber layer. The spatial separation of the IBCs is in a direction perpendicular to the back surface, thus providing borderless contacts having a zero-footprint separation. As the contacts are on the back, photons incident on the cell's front surface can be absorbed without any shadowing.

24 Claims, 6 Drawing Sheets

(56) References Cited

U.S. PATENT DOCUMENTS

| | | | |
|---|---|---|---|
| 2006/0137737 A1* | 6/2006 | Nakayama et al. | 136/255 |
| 2009/0008787 A1* | 1/2009 | Wenham | H01L 31/022425 257/773 |
| 2009/0104432 A1* | 4/2009 | Gazda | 428/323 |
| 2009/0142880 A1* | 6/2009 | Weidman | H01L 31/022425 438/98 |
| 2009/0159111 A1* | 6/2009 | Jawarani | H01L 31/1804 136/244 |
| 2009/0286347 A1* | 11/2009 | Kim | H01L 31/022441 438/72 |
| 2010/0206369 A1* | 8/2010 | Kim et al. | 136/255 |
| 2011/0284060 A1* | 11/2011 | Lee | H01L 31/022441 136/255 |
| 2012/0037211 A1* | 2/2012 | Zhu | H01L 31/035281 136/249 |

OTHER PUBLICATIONS

Zhang et al., "Schottky-Barrier Height Tuning by Means of Ion Implementation Into Preformed Silicide Films Followed by Drive-In Anneal," IEEE Electron Device Letters, vol. 28, No. 7, Jul. 2007.

Qiu et al., "A Comparative Study of Two Different Schemes to Dopant Segregation at NiSi/Si and PtSi/Si Interfaces for Schottky Barrier Height Lowering," IEEE Transactions on Electron Devices, vol. 55, No. 7, pp. 386-403, 2008.

\* cited by examiner

SOLAR CELL WITH INTERDIGITATED BACK CONTACTS FORMED FROM HIGH AND LOW WORK-FUNCTION-TUNED SILICIDES OF THE SAME METAL

FIELD OF THE DISCLOSURE

The present disclosure relates to solar cells having interdigitated back contacts (IBCs), which cover essentially the entire back surface of a lightly-doped absorber such that the area used for absorption of photons and charge-separation between electrons and holes is maximized.

BACKGROUND

Recently, there has been renewed interest in solar cells as alternative energy sources. To increase the efficiency of solar cells, it is desirable to maximize the active area of a solar cell, i.e., the area of the cell that absorbs light. However, design constraints make it necessary to provide, for example, electrical contacts to allow for the use of the electrical power generated by the cell, or separators between p- and n-doped regions of the cell to avoid rapid charge recombination of electron/hole pairs generated by absorbed light. These design constraints may limit the active area available for light absorption, thereby lowering the actual cell efficiency below the theoretical maximum photon-to-electron conversion efficiency.

Inderdigitated back contacts (IBCs) allow to attach electrical contacts to the back side, i.e., the side facing away from the light source, which avoids shadowing losses that otherwise take place in solar cells with electrical contacts on the front side, i.e., the side facing the light source. Nevertheless, traditional IBC solar cells contain an insulating region as a separator between p- and n-doped regions of the cell to prevent charge recombination. The insulating region, however, reduces the amount of active area for photon absorption, and, consequentially, the efficiency of the solar cell. Moreover, the insulating region, also referred to as spacing or border, between interdigitated contacts must further include a budget for misalignment because contacts defined in different lithography levels may not be in perfect alignment.

Further, solar cell designs utilizing n-doped and p-doped regions that are interdigitated back contacts offer a number of advantages in both solar cell efficiency and ease of processing. IBCs can be advantageous to process in cases where only one side of a quasi-planar absorber layer is accessible for contact formation or in cases where having both contacts on the same side of the absorber layer makes it easier to connect the adjacent solar cells comprising a solar module. It would therefore be extremely desirable to have a method to make interdigitated contacts that allows the contact (or carrier collection) area to be maximized while minimizing the potential for contact misalignment.

SUMMARY OF THE DISCLOSURE

In this disclosure, n-doped and p-doped regions of an IBC solar cell are spaced apart not within a plane, but in a direction perpendicular to the back surface of the solar cell. This geometry allows maximization of the active area of the solar cell because no separator region has to be provided within the plane of the active area.

In a typical embodiment, a borderless interdigitated back contact solar cell is provided with a lightly-doped absorber having a front surface and a back surface; at least, one of a p-doped region and a high work function region disposed on the lightly-doped absorber; and at least one of a n-doped region and a low work function region disposed on the lightly-doped absorber; wherein the at least one of the p-doped region and the high work function region are provided in a recess of the back surface and the at least one of the n-doped region and the low work function region are provided at the back surface; or wherein the at least one of the n-doped region and the low work function region are provided in a recess of the back surface and the at least one of the p-doped region and the high work function region are provided at the back surface.

Further, a preferred method of forming a borderless interdigitated back contact solar cell is disclosed, which comprises providing a lightly-doped absorber having a front surface and a back surface; providing at least one of a p-doped region and a high work function region disposed on the lightly-doped absorber; and providing at least one of a n-doped region and a low work function region disposed on the lightly-doped absorber; wherein the at least one of the p-doped region and the high work function region are provided in a recess of the back surface and the at least one of the n-doped region and the low work function region are provided at the back surface; or wherein the at least one of the n-doped region and the low work function region are provided in a recess of the back surface and the at least one of the p-doped region and the high work function region are provided at the back surface.

BRIEF DESCRIPTION OF THE DRAWINGS

FIG. 1 shows a sideview of an IBC solar cell of the related art. A p-doped substrate 100 with high minority carrier lifetime is provided with a silicon dioxide passivation layer and anti-reflective coating 110. Absorption of photons within substrate 100 generates electron hole pairs that diffuse through the substrate and are collected at the rear of the cell by n-doped region 150 and p-doped region 140, respectively. Electrons are collected and provided to an external circuit through negative contact 120 and positive contact 130.

FIGS. 2a to 2l show an exemplary process flow for a borderless interdigitated back contact solar cell.

FIG. 2a shows a lightly doped absorber 200, which is p-doped. However, n-doped absorbers are also within the scope of the instant disclosure.

FIG. 2b shows the blanket deposition or implantation of p-type dopants to form a p-doped region 210 within a surface region at the back surface of the lightly doped absorber 200 under an optional screen oxide layer (not shown).

FIG. 2c shows the formation of hardmask layer 220 on blanket p-doped region 210.

FIG. 2d shows the formation of recesses 230 within the lightly doped absorber.

FIG. 2e shows side wall spacers (SWS) 240 being provided within recess 230. Further, a shallow n-type dopant deposition or implantation is provided to form n-doped regions 250.

FIG. 2f shows an anneal of the doped regions by $O_2$ drive-in, wherein the thickness of the doped regions increases, in particular p-doped region 220 increasing as indicated at 222 and n-doped region 250 increasing as indicated at 252. Hardmask layer 220 and sidewall spacers 240 are preferably removed prior to the drive-in anneal as shown, but may alternatively be left in the structure if they are insulating.

FIGS. 5a-5i show a second exemplary process flow for a borderless interdigitated back contact solar cell.

FIG. 5a shows a lightly doped absorber 500, which is p-doped. However, n-doped absorbers are also within the scope of the instant disclosure.

FIG. 5b shows the formation of a n-doped region 510 by blanket implantation at the back surface.

FIG. 5c shows the formation of a hardmask layer 520 on the n-doped region 510.

FIG. 5d shows the formation of recess 530 within absorber 500 and extending through the hardmask layer and the n-doped region.

FIG. 5e shows the formation of sidewall spacers (SWS) 540 within recess 530, followed by a blanket implantation of p-doped regions 511 within the bottom of recess 530.

FIG. 5i shows a top view of the structure of FIG. 5h. Dashed line 550 corresponds to the cross section of FIGS. 5d to 5h. Metal layer 590 connects the individual p-doped regions and metal layer 591 connects the individual n-doped regions within the substrate 500.

DESCRIPTION OF THE BEST AND VARIOUS EMBODIMENTS

The foregoing and other objects, aspects, and advantages will be better understood from the following detailed description of the best and various embodiments. Throughout the various views and illustrative embodiments of the present disclosure, like reference numbers are used to designate like elements.

In a typical embodiment, an interdigitated borderless contact structure is fabricated of n-doped and p-doped contact regions that are both separated from each other and self-aligned with respect to each other. An important geometric feature of this structure is that one set of contacts is recessed relative to the other, so that the spacing between the contacts is in a vertical dimension rather than a horizontal one. The spacing between the contacts can thus be varied just by changing the recess depth, without changing a photolithographic mask.

In the exemplary process flow of FIGS. 2a to 2l, borderless interdigitated contacts are provided in a solar cell. The exemplary flow is illustrated for the case of ion-implanted dopants and silicon, though other doping methods and absorber layers could be used. For example, one or both of the n-type (or low work function) and p-type (or high work function) contact regions might be formed by a blanket or self-aligned silicide instead of by ion implantation.

The IBCs are obtained by placing at least one of a metallic material having a high work function onto one part of a lightly-doped absorber and/or a second metallic material in a different location having a low work function. Typically, a low temperature annealing of the metallic materials may be performed to form silicides if the substrate material is Si and germanides if the substrate material is Ge.

In contrast to an interdigitated front contact (IFC) device the metallic materials may be thick and transparency is not required.

The instant IBCs contain surfaces of separation regions between the n-doped regions and p-doped contacts that are perpendicular to the plane of the back surface. Perpendicular sidewalls allow for the isolation regions between n-doped regions and p-doped regions to have a near-zero-area footprint, leaving more area for the desired n-doped regions and p-doped regions.

Typically, recesses with quasi-vertical sidewalls are formed by reactive ion etching (RIE) through a mask, a method that works with any type of silicon and with any type of crystallinity (amorphous, polycrystalline, and single crystal with any orientation). Alternatively, for certain specific combinations of Si surface orientation and recess (trench) orientation, recesses with quasi-vertical sidewalls may also be formed by anisotropic wet etching through a mask, using etchants such as tetramethyl ammonium hydroxide (TMAH) or KOH, which have very low etch rates for surface planes having a 111 orientation. For example, Si with a 110 surface orientation can be patterned with an anisotropic wet etch through a mask to form trenches having vertical sidewalls comprising 111 planes. In contrast, anisotropic wet etching of 100-oriented Si through a mask would typically result in sidewalls comprising 111 planes of Si having an inclination of about 54° to the horizontal, which is not desired for the IBCs herein because the sloped sidewalls would not have a near-zero-footprint.

Both self-aligned and non-self-aligned approaches may be used to provide the metallization for the n-doped and p-doped regions. In the self-aligned approach shown in FIGS. 5g and 5h, the recess must be thicker than the added metal thickness to avoid contact between the top of the metal contacting the recessed regions and the bottom of the metal contacting the non-recessed regions. Self-aligned approaches typically utilize selective metallization processes such as those that selectively plate metal directly on the n-doped and p-doped regions; self-aligned silicide (salicide) processes, which include blanket metal deposition, selective reaction with Si to make a silicide over n the n-doped and p-doped regions followed by the selective etch of unreacted metal over the sidewall spacer regions; and selective plating on a silicide seed layer formed by the aforementioned salicide process. A preferred embodiment is forming a silicide seed layer and selectively plating Cu.

Figure 5A:
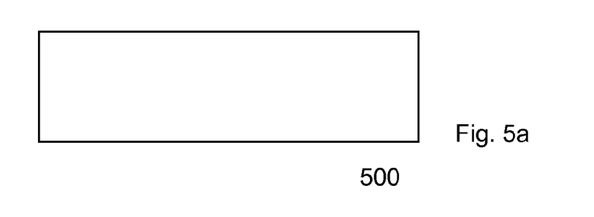
Figure 5B:
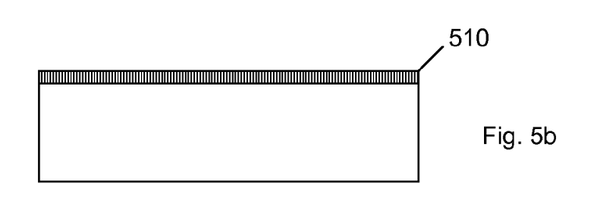
Figure 5C:
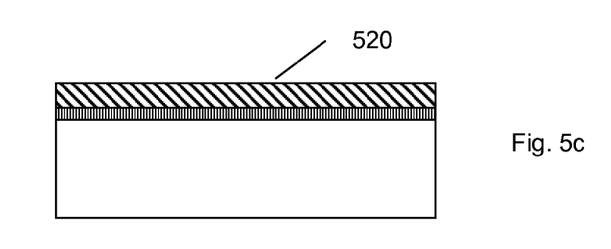
Figure 5D:
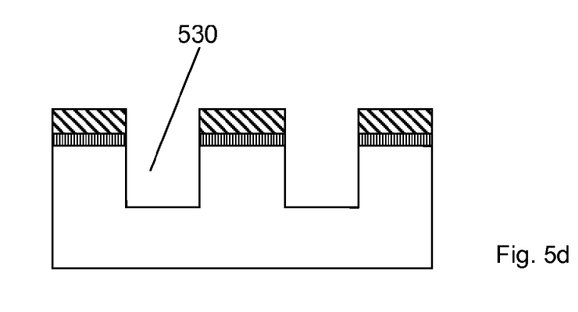
Figure 5E:
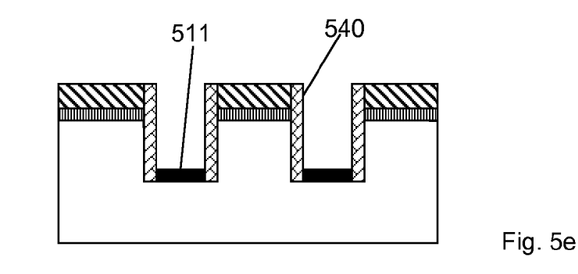
Figure 5F:
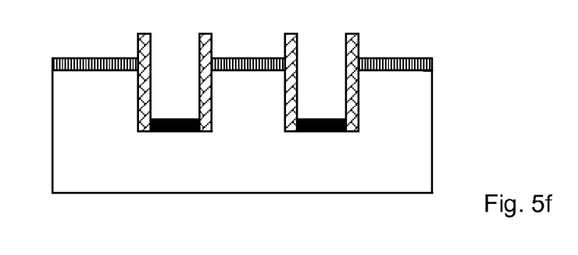
FIG. 5f shows the removal of the remainder of hardmask layer 520.
Figure 5G:
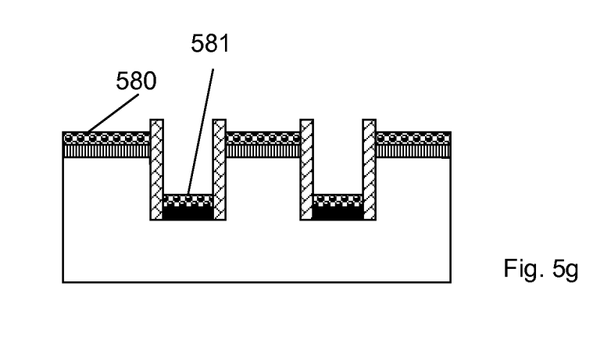
FIG. 5g shows the structure of FIG. 5f after blanket deposit of a metal on the p-doped and the n-doped regions 510 and 511 followed by an anneal and selective metal etch to form metal silicide regions 580 and 581 self-aligned to regions 510 and 511.
Figure 5H:
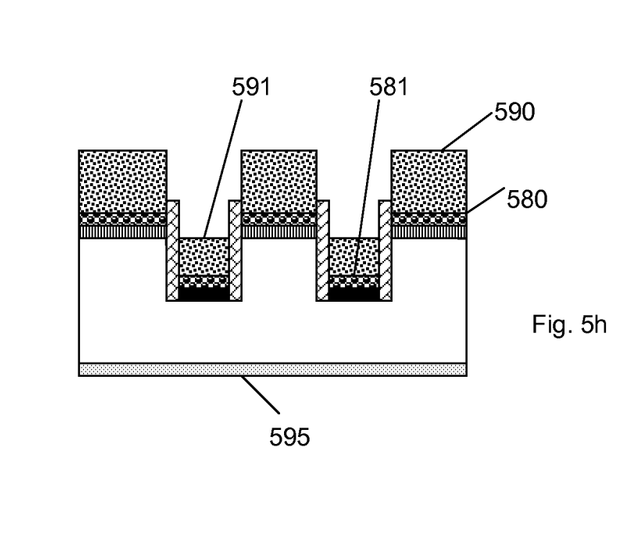
FIG. 5h shows the structure of FIG. 5g after implementation of a self-aligned contact scheme in which non-connecting metal layers 590 and 591 (which may be the same metal deposited in the same deposition step) are provided on top of metal silicide regions 580 and 581 by a deposition process. To prevent shorting, the top of metal layer 591 over silicide regions 581 must remain thin enough not to connect to the bottom region of metal layer 590 over silicide regions 580. In addition, the front surface of the solar cell is passivated and provided with an antireflective coating 595. It is noted that this front surface treatment may alternatively be performed earlier or later in the process.
Figure 5I:
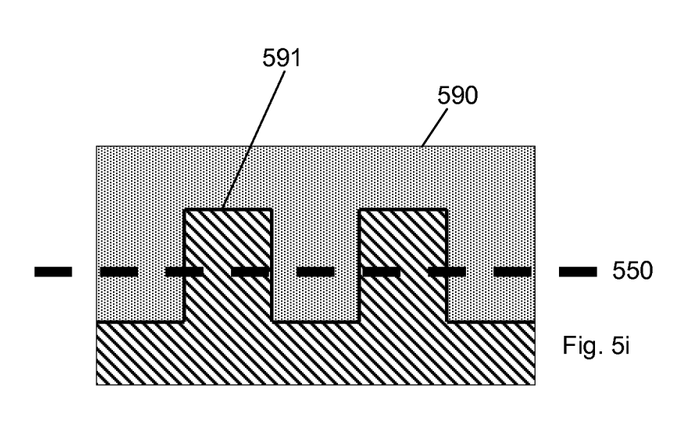

Under certain circumstances, the self-aligned metallization of FIGS. 5g and 5h may also be accomplished with a blanket (non-selective) deposition process. For example, a highly directional physical vapor deposition process (e.g., evaporation or collimated sputtering) may be used to form separated contacts 590 and 591 of FIG. 5h if residuals on the upper portion of sidewall spacers 540 are negligible (or thin enough to be removable without significantly reducing the thickness of the remaining contact).

Figure 1:
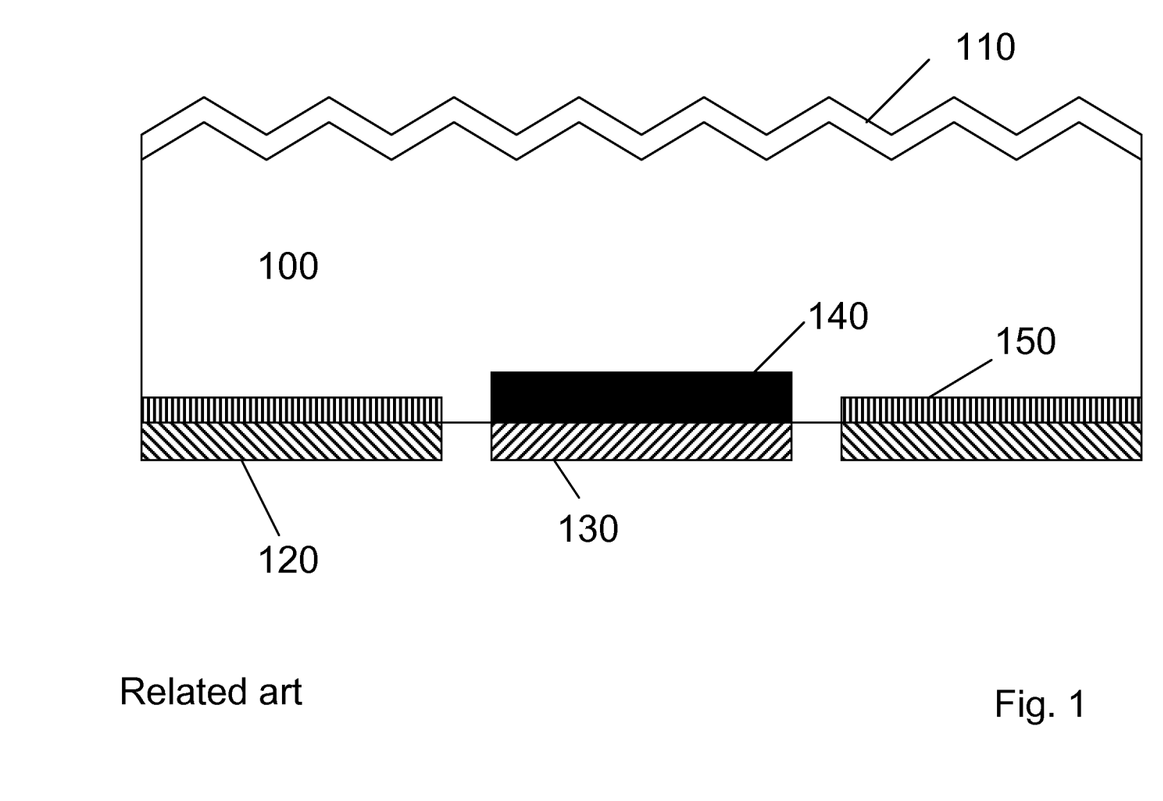
Figures 2A, 2B:
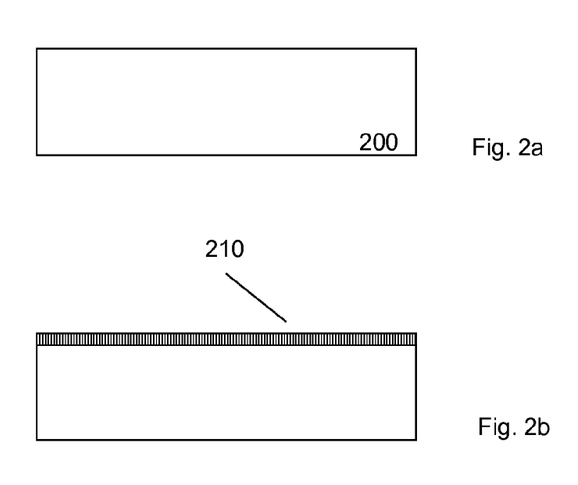
Figure 2C:
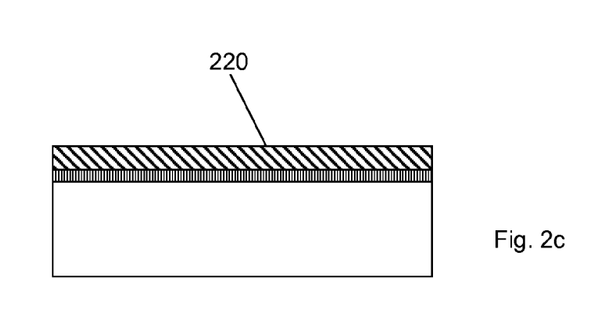
Figures 2D, 2E:
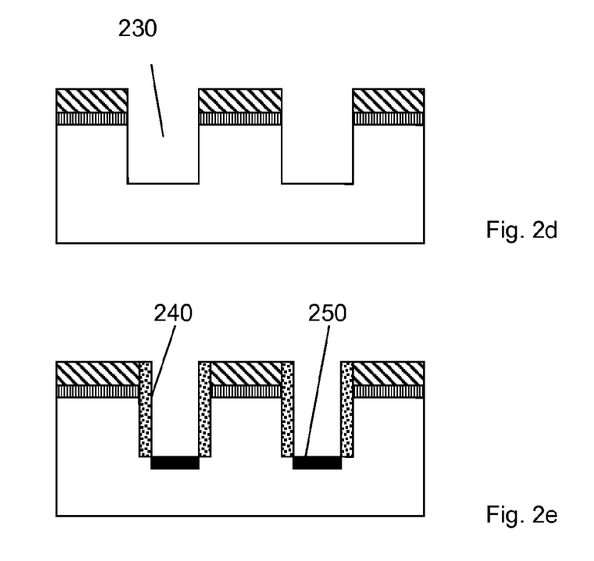
Figure 2F:
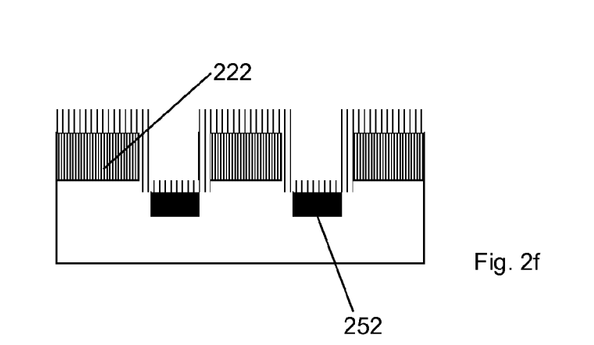
Figure 2G:
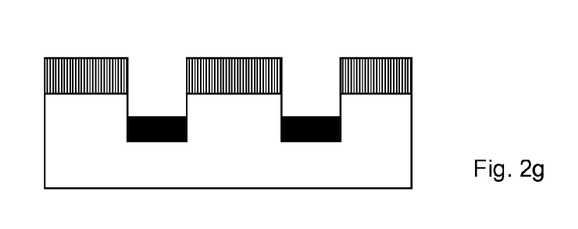
FIG. 2g shows the substrate after the performance of an oxide strip.
Figure 2H:
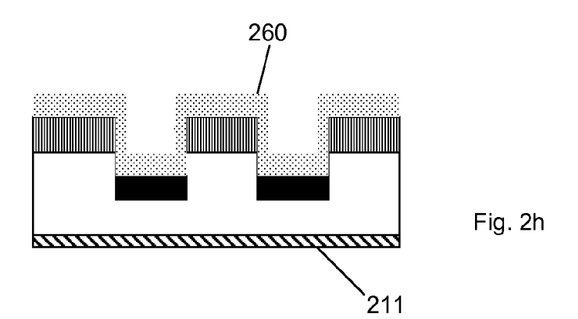
FIG. 2h shows the structure of FIG. 2g after front surface passivation and formation of an optional antireflection coating layer 211 (where it is noted that this front surface treatment may alternatively be performed earlier or later in the process) and after deposition of passivating/insulating layer 260, on the back surface (where it is noted that layer 260 is optional if sidewall spacers 240 and hardmask layer 220 still remain in the structure).
Figure 2I:
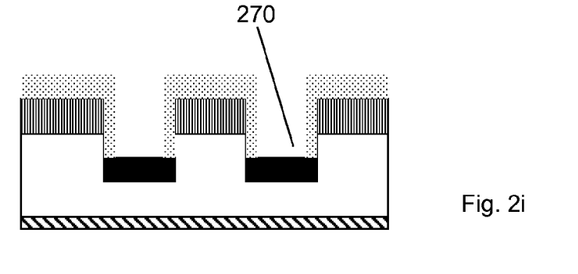
FIG. 2i shows the opening of contact holes 270 in layer 260 to n-doped regions 252.
Figure 2J:
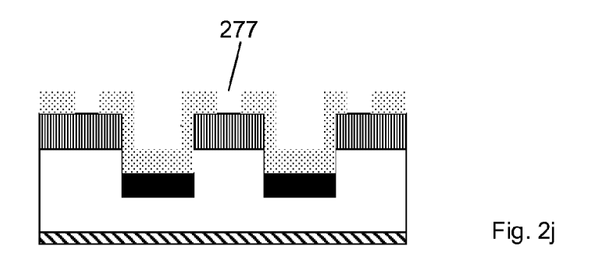
FIG. 2j shows a different cross section of the substrate after the steps of FIG. 2h and after contact holes 277 for p-doped regions 222 have been provided.
Figure 2K:
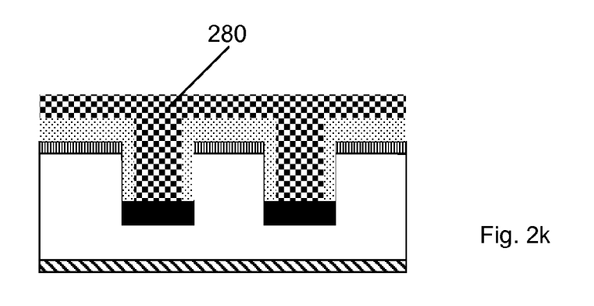
FIG. 2k shows the structure of FIG. 2i after implementation of a non-self-aligned contact scheme utilizing the formation of metal layers 280 connecting the n-doped regions to the external circuit.
Figure 2L:
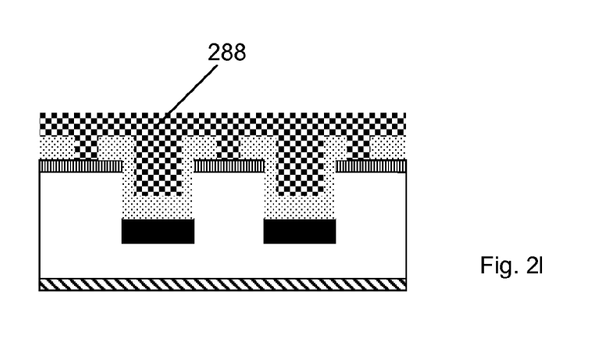
FIG. 2l shows the structure of FIG. 2j after implementation of the FIG. 2k non-self-aligned contact scheme utilizing the formation of metal layers 288 connecting the p-doped regions to the external circuit.
Figure 3:
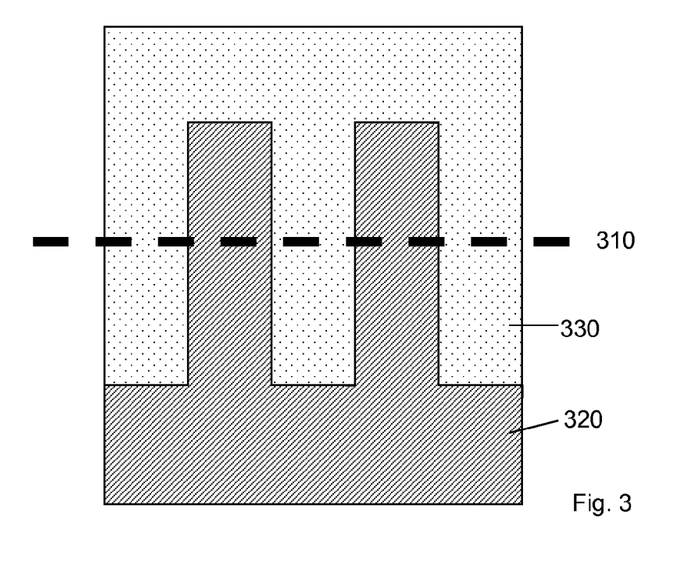
FIG. 3 shows interdigitated p-doped regions 320 and n-doped regions 330 in plan view. Dashed line 310 corresponds to a cross-section as depicted in FIGS. 2d-2h.
Figure 4:
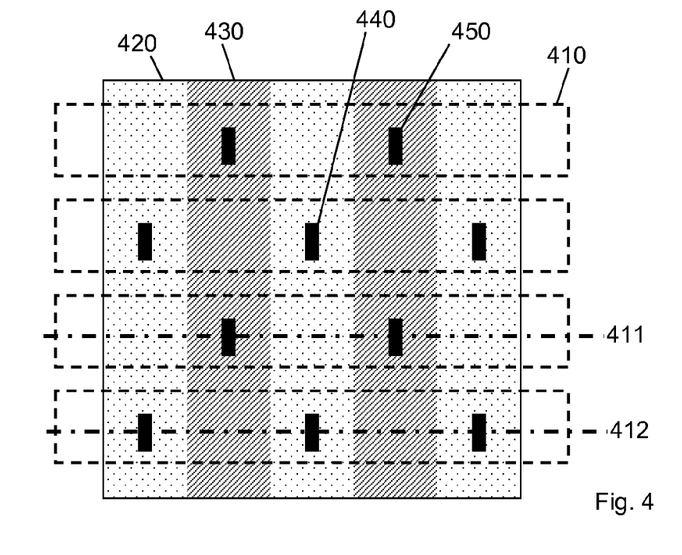
FIG. 4 depicts alternating interdigitated regions 420 and 430 having electrical contacts 440 and 450, respectively, where dashed line 411 corresponds to a cross-section as depicted in FIGS. 2i and 2k and dashed line 412 corresponds to a cross-section as depicted in FIGS. 2j and 2l. Electrical contacts 450 are connected by the same metal layer which is placed in the area indicated by dashed rectangle 410.

In non-self-aligned approaches, one or more patterned metals may be used to form separated contacts. For example, a coarsely patterned metal may be deposited through a dielectric layer patterned with contact vias, as shown in FIGS. 2k, 2l, and 4. Alternatively, the metallization might be a mix of self-aligned and non-self-aligned approaches. For example, a first patterned metal might be selective and self-aligned for contacts to one doping type while a second patterned metal might be non-self-aligned for contacts to the other doping type.

In a preferred embodiment, IBCs have work-function tuned silicides on the back surface of a crystalline Si absorber layer, which are formed from the same metal silicide (MSix) for both n-type and p-type contacts, with work function tuning effected by introducing different dopants that segregate to the Si/MSix interface. This approach offers reduced process complexity because the metal for both silicide contacts can be deposited in the same process step, low thermal budget, and the potential of lower cost processing.

Specifically, the same metal silicide, using a single metal, can be used to form both the high and low work function junctions, which replace the p-doped region and the n-doped region, respectively. By incorporating p-type or n-type dopants to tailor the local work function, producing high barrier height Schottky junctions and low barrier height "ohmic contacts" allows using the same metal for both contacts. Annealing is performed to create the silicides and to activate the desired dopants incorporated into the silicide or into the Si adjacent to the silicide.

Disclosed herein are exemplary IBC solar cell geometries utilizing n-type and p-type workfunction-tuned silicides, shown in FIG. 5, along with a representative process flow by which such cell structures may be made. In these structures, connecting the individual cells to make arrays of solar cells is a simple task because both sets of contacts are on the same side of the cell. The contact scheme will vary depending on whether the cells are to be connected in series (n-contact of one cell to p-contact of the next, so the voltages add, a "monolithic" configuration) or in parallel (n-contacts of all cells connected to a first terminal and p-contacts of all cells connected to a second terminal, so the currents add). It should be noted that monolithic design, while utilizing similar junction formation as presented here, would additionally require an insulating substrate ($SiO_2$, ceramic, polymer) and separation of the large silicon devices into multiple small areas by laser cutting or an isolation etch.

The dopants that segregate to the MSix/Si interface are preferably introduced prior to metal deposition. The metal for the silicide regions is blanket-deposited on a surface containing regions of exposed Si with which the metal will react to form a silicide, and regions of nonreactive material (e.g., sidewall spacers of $SiO_2$) with which the metal will not react. A typical method of introducing dopants is by low energy ion implantation. Low energy is preferable so that the dopants remain close to the Si surface. After annealing to form a silicide, the unreacted metal is removed by a selective etch that leaves the metal silicide.

The dopants that segregate to the MSix/Si interface may also be introduced during the metal deposition step itself, for example by sputter depositing from a doped metal alloy target optimized for one of the electrode contact types. However, this requires the presence of compensating dopants in the other electrode contact type at a level much higher than that introduced from the deposited metal.

FIGS. 5a to 5h show an exemplary process flow for making borderless interdigitated contacts in a solar cell utilizing metal silicides workfunction tuned with MSix/Si interface-segregated dopants.

These solar cells with high and low work-function-tuned silicides of the same metal may be implemented with a wide range of finger dimensions, front surface texture, passivation layers, antireflection coatings, etc. and are meant to be exemplary rather than limiting.

In a typical embodiment, a borderless interdigitated back contact solar cell further comprises a front surface layer having a higher concentration of a dopant having the same doping type as the lightly doped absorber.

In another typical embodiment, the borderless interdigitated back solar cell comprises a first conductive contact region at the at least one of the p-doped region and the high work function region and a second conductive contact region at the at least one of the n-doped region and the low work function region.

Typically, the lightly doped absorber of the borderless interdigitated back contact solar cell is monocrystalline or polycrystalline. The lightly doped absorber is typically a material selected from the group consisting of Si, Ge, and SiGe alloys.

In another typical embodiment, the lightly-doped absorber is n-doped. In yet another typical embodiment, the lightly-doped absorber is p-doped.

Further, in a typical embodiment the at least one of the p-doped region and the high work function region and the at least one of the n-doped region and the low work function region are vertically spaced-apart by a distance of from about 1 micrometer to about 200 micrometers. In more preferred embodiment, the at least one of the p-doped region and the high work function region and the at least one of the n-doped region and the low work function region are vertically spaced-apart by a distance of from about 5 micrometers to about 50 micrometers.

In a particular embodiment, the at least one of the p-doped region and the high work function regions of the interdigitated back contact solar cell comprises the high work function region. In another particular embodiment, at least one of the n-doped region and the low work function regions of the borderless interdigitated back contact solar cell comprises the low work function region.

With particularity, the high work function region provides a potential difference having a magnitude of at least 0.2 volts at an interface with the lightly-doped absorber. Also with particularity, the low work function region provides a potential difference having a magnitude of at least 0.2 volts at an interface with the lightly-doped absorber.

In a particular embodiment, the high work function region is a metal-containing material selected from the group consisting of metal, metal silicide, and metal germanides, or mixtures or multilayers thereof. In another particular embodiment, the low work function region is a metal-containing material selected from the group consisting of metal, metal silicide, and metal germanides, or mixtures or multilayers thereof. With particularity, the metal for the high work function region is selected from the group consisting of nickel, platinum, nickel platinum, cobalt, titanium, and tungsten. Also with particularity, the metal for the low work function region is selected from the group consisting of nickel, platinum, nickel platinum, cobalt, titanium, and tungsten.

In yet another particular embodiment, a dopant of the lightly-doped absorber is selected from the group consisting of Al, As, B, Ga, In, P, and Sb.

With particularity, the borderless interdigitated back contact solar cell comprises a sidewall between the at least one of the n-doped region or the low work function region and between the at least one of the p-doped region and the high work function region, wherein the sidewall is substantially perpendicular to the front surface.

Also with particularity, an insulating sidewall spacer is disposed on the sidewall. In yet another particular embodiment, the insulating sidewall spacer is selected from the group consisting of insulating oxides, insulating nitrides, ceramics, and polymers, or mixtures or multilayers of thereof. In a particular embodiment, the insulating oxide is silicon oxide. In another particular embodiment, the insulating nitride is silicon nitride.

With particularity, the borderless interdigitated back contact solar cell comprises at least one of a conductive contact, a transparent conductive oxide layer, an antireflective coating, a surface texturing, and a surface passivation layer Typically, a concentration of a dopant in the lightly-doped absorber is of from about $1 \cdot 10^{13}$ atoms $cm^{-3}$ to about $1 \cdot 10^{17}$ atoms $cm^{-3}$. Also typically, a concentration of the same dopant in the supplemental absorber region is of from about $1 \cdot 10^{17}$ atoms $cm^{-3}$ to about $1 \cdot 10^{21}$ atoms $cm^{-3}$.

With particularity, a concentration of a dopant in the p-doped region is of from about $1 \cdot 10^{13}$ atoms $cm^{-3}$ to about $1 \cdot 10^{17}$ atoms $cm^{-3}$. Also with particularity, a concentration of a dopant in the n-doped region is of from about $1 \cdot 10^{17}$ atoms $cm^{-3}$ to about $1 \cdot 10^{21}$ atoms $cm^{-3}$.

For borderless interdigitated back contact solar cell possessing silicided contacts, a TiN cap can be deposited on top of the low work function (Wf) and high work function (Wf) metals to prevent oxidation of the metals before forming the silicide.

While the examples of the present disclosure utilize borderless interdigitated back contact solar cell comprising metals with high work functions and low work functions to create two potential differences, solar cells in which one potential difference is created by metal silicide work function tuning and a second potential difference is created by conventional doping (diffusion, ion implantation, or in-situ doping during semiconductor layer growth) are also contemplated.

In a preferred embodiment, the same metal is used for both silicides by adding acceptor or donor dopants into the silicide and adjacent regions of the Si. Both high work function and low work function tuning can be achieved from one silicide by interface modification.

In a preferred embodiment, Ni is used as the metal for the metal silicide because the self-aligned Ni silicide process is well-understood and considered a mature processing method. Ni is the dominating diffusion species during the silicide reaction and NiSi has very low resistivity (about 10 $\mu\Omega \cdot cm$). The dopant-segregation can also be induced by implantation into Si, which is then followed by silicidation.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

The foregoing description of the disclosure illustrates and describes the present disclosure. Additionally, the disclosure shows and describes only the preferred embodiments but as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

What is claimed is:

1. A method of forming a borderless interdigitated back contact solar cell comprising:
    providing a lightly-doped absorber having a front surface and a back surface;
    providing at least one of a first dopant type region and a first work function region disposed on said back surface;
    forming trenches in said back surface;
    forming sidewall spacers on trench sidewalls and only extending from the trench floors to said back surface;
    providing at least one of a second dopant type region and a second work function region disposed on the trench floors between said sidewall spacers, the second regions being horizontally self-aligned to the first region by respective sidewalls spacers;
    forming a dopant-segregated interface of said first dopant type on said back surface between said trenches and a dopant-segregated interface of said second dopant type on the trench floors, each said dopant-segregated interface tuning work function at the interface,
    wherein the at least one of the first dopant type region and the first work function region and the at least one of the second dopant type region and the second work function region are at opposite ends of one of said sidewall spacers, and separated vertically from each other and self-aligned with respect to each other by said respective sidewalls spacers.

2. The method for forming a borderless interdigitated back contact solar cell according to claim 1, which further comprises doping a front surface layer having at a higher concentration of a dopant having the same doping type as the lightly doped absorber.

3. The method for forming a borderless interdigitated back contact solar cell according to claim 1, which further comprises providing conductive contacts to the at least one of the first dopant type region and the first work function region and to the at least one of the second dopant type region and the second work function region.

4. The method for forming a borderless interdigitated back contact solar cell according to claim 1, wherein the lightly doped absorber is mono crystalline or polycrystalline.

5. The method for forming a borderless interdigitated back contact solar cell according to claim 1, wherein the lightly doped absorber is a material selected from the group consisting of Si, Ge, and SiGe alloys.

6. The method for forming a borderless interdigitated back contact solar cell according to claim 1, wherein the lightly-doped absorber is n-doped.

7. The method for forming a borderless interdigitated back contact solar cell according to claim 1, wherein the lightly-doped absorber is p-doped.

8. The method for forming a borderless interdigitated back contact solar cell according to claim 1, wherein said trenches are 1-200 micrometers deep such that the at least one of the first dopant type region and the first work function region and the at least one of the second dopant type region and the second work function region are spaced-apart by a distance of from about 1 micrometer to about 200 micrometers.

9. The method for forming a borderless interdigitated back contact solar cell according to claim 8, wherein said trenches are 5-50 micrometers deep such that the at least one of the first dopant type region and the first work function region and the at least one of the second dopant type region and the second work function region are spaced-apart by a distance of from about 5 micrometers to about 50 micrometers.

10. The method for forming borderless interdigitated back contact solar cell according to claim 1, wherein the first dopant type is p-type, the first work function region is a high work function region, second dopant type is n-type, and the second work function region is a low work function region.

11. The method for forming a borderless interdigitated back contact solar cell according to claim 1, wherein the first dopant type is n-type, the first work function region is a low work function region, the second dopant type is p-type, and the second work function region is a high work function region.

12. The method for forming a borderless interdigitated back contact solar cell according to claim 1, wherein the at least one of the first dopant type region and the first work function region is a high work function region providing a potential difference having a magnitude of at least 0.2 volts at an interface with the lightly-doped absorber.

13. The method for forming a borderless interdigitated back contact solar cell according to claim 12, wherein the at least one of the second dopant type region and the second work function region is a low work function region providing a potential difference having a magnitude of at least 0.2 volts at an interface with the lightly-doped absorber.

14. The method for forming a borderless interdigitated back contact solar cell according to claim 13, wherein the high work function region is a metal-containing material selected from the group consisting of metal, metal silicide, and metal germanides, or mixtures or multi layers thereof.

15. The method for forming a borderless interdigitated back contact solar cell according to claim 14, wherein the low work function region is a metal-containing material selected from the group consisting of metal, metal silicide, and metal germanides, or mixtures or multi layers thereof.

16. The method for forming a borderless interdigitated back contact solar cell according to claim 14, wherein the metal is selected from the group consisting of nickel, platinum, nickel platinum, cobalt, titanium, and tungsten.

17. The method for forming a borderless interdigitated back contact solar cell according to claim 15, wherein the metal is selected from the group consisting of nickel, platinum, nickel platinum, cobalt, titanium, and tungsten.

18. The method for forming a borderless interdigitated back contact solar cell according to claim 1, wherein a dopant of the lightly-doped absorber is selected from the group consisting of Al, As, B, Ga, In, P, and Sb.

19. The method for forming a borderless interdigitated back contact solar cell according to claim 1, wherein which forming said sidewall spacers forms insulating sidewall spacers on said trench sidewalls.

20. The method for forming a borderless interdigitated back contact solar cell according to claim 19, wherein the insulating sidewall spacers are formed from a material selected from the group consisting of insulating oxides, insulating nitrides, ceramics, and polymers, or mixtures or multilayers of thereof.

21. The method for forming a borderless interdigitated back contact solar cell according to claim 20, wherein the insulating oxide is silicon oxide.

22. The method for forming a borderless interdigitated back contact solar cell according to claim 20, wherein the insulating nitride is silicon nitride.

23. The method for forming a borderless interdigitated back contact solar cell according to claim 1, further comprising forming an antireflective coating on said front surface.

24. A method of forming a borderless interdigitated back contact solar cell comprising:
providing a lightly-doped absorber having a front surface and a back surface and trenches in said back surface;
providing at least one of a p-doped region and a high work function region disposed on the lightly-doped absorber;
providing at least one of a n-doped region and a low work function region disposed on the lightly-doped absorber, wherein the at least one of the p-doped region and the high work function region are provided in said trenches and the at least one of the n-doped region and the low work function region are provided at the back surface and self-aligned from each other by respective sidewalls spacers, or wherein the at least one of the n-doped region and the low work function region are provided in said trenches and the at least one of the p-doped region and the high work function region are provided at the back surface and self-aligned from each other by respective sidewalls spacers; and
forming a dopant-segregated interface of a respective dopant type on said back surface between said trenches and a dopant-segregated interface of the other respective dopant type on the trench floors and at opposite ends of a respective sidewall spacer, each said dopant-segregated interface tuning work function at the interface, wherein the sidewall spacers only extend from the trench floors to said back surface.

* * * * *